United States Patent [19]
Lotfi

[11] Patent Number: 5,828,239
[45] Date of Patent: Oct. 27, 1998

[54] SENSE AMPLIFIER CIRCUIT WITH MINIMIZED CLOCK SKEW EFFECT

[75] Inventor: Younes Lotfi, Round Rock, Tex.

[73] Assignee: International Business Machines Corporation, Armonk, N.Y.

[21] Appl. No.: 839,565

[22] Filed: Apr. 14, 1997

[51] Int. Cl.$^6$ ........................................ G01R 7/06
[52] U.S. Cl. ................................. 327/51; 327/57
[58] Field of Search ........................... 327/51–57

[56] References Cited

U.S. PATENT DOCUMENTS

| Re. 34,026 | 8/1992 | Duvvury et al. | 365/205 |
| 3,978,459 | 8/1976 | Koo | 340/173 R |
| 4,039,861 | 8/1977 | Heller et al. | 307/355 |
| 4,255,678 | 3/1981 | Suzuki et al. | 307/355 |
| 4,421,996 | 12/1983 | Chuang et al. | 307/530 |
| 4,504,748 | 3/1985 | Oritani | 307/530 |
| 4,504,929 | 3/1985 | Takemae et al. | 365/210 |
| 4,558,241 | 12/1985 | Suzuki et al. | 327/57 |
| 4,694,205 | 9/1987 | Shu et al. | 307/530 |
| 4,816,706 | 3/1989 | Dhong et al. | 307/530 |
| 4,843,264 | 6/1989 | Galbraith | 307/530 |
| 5,017,815 | 5/1991 | Shah et al. | 307/530 |
| 5,027,324 | 6/1991 | Seo | 365/205 |
| 5,130,580 | 7/1992 | Min et al. | 327/53 |
| 5,267,197 | 11/1993 | McClure | 365/189.01 |
| 5,511,031 | 4/1996 | Grover et al. | 365/208 |
| 5,544,110 | 8/1996 | Yuh | 365/205 |
| 5,568,073 | 10/1996 | McClure | 327/51 |

OTHER PUBLICATIONS

"Low–Power, High–Speed Sense Latch," J.L. Chu and H.L. Kalter, *IBM Technical Disclosure Bulletin*, vol. 17, No. 9, 2582–2583 (Feb. 1975).

Primary Examiner—Toan Tran
Attorney, Agent, or Firm—Sawyer & Associates; Anthony V.S. England

[57] ABSTRACT

A sense amplifier with improved compensation for clock skew effects is provided and includes a sense amplifier enabling mechanism for receiving first and second control signals. The sense amplifier further includes a first logic mechanism for providing the first control signal to a first input of the sense amplifier enabling mechanism, and a second logic mechanism for providing the second control signal to a second input of the sense amplifier enabling mechanism, wherein the first and second logic mechanisms reduce speed degradation by minimizing skew between the first and second control signals. In a method aspect, a method for reducing speed degradation in a sense amplifier includes providing a pull down device, and coupling the pull down device to first and second signal paths, the first signal path propagating a first clock signal and the second signal path propagating a second clock signal, for reducing speed degradation resulting from skew between the first and second clock signals. The method further includes providing the first signal path to a gate of the pull down device and providing the second signal path to a source of the pull down device.

22 Claims, 4 Drawing Sheets

SENSE AMPLIFIER CIRCUIT WITH MINIMIZED CLOCK SKEW EFFECT

FIELD OF THE INVENTION

The present invention relates generally to sense amplifiers and more particularly to reducing delay caused by clock skew in sense amplifiers.

BACKGROUND OF THE INVENTION

In typical semiconductor memory arrays, individual memory cells forming an array have data input and output lines. Commonly, each memory cell has two output bit lines for indicating the presence of a '0' or '1' bit read out from the memory cell. The '0' and '1' bits are suitably represented by different voltages, which, when stored initially in the memory cells, may be quite close to one another. Accumulated errors reduce the differences between the voltages to the order of tens of millivolts. Accordingly, sense amplifiers are typically included for connection to the output bit lines. The sense amplifiers are usually adapted to more accurately detect the voltages appearing on the bit lines and to latch the digital bit indicated thereby to provide a more accurate and faster readout.

In microprocessor and memory designs, a multiphase clock is also commonly used for improved performance reasons, including use in sense amplifiers. While using multiphase clocks in sense amplifiers tends to improve the signal differential at lower frequency operation, clock skew problems result in significant speed path degradation for high frequency designs.

To further explain the clock skew problem, refer now to FIGS. 1A and 1B. FIG. 1A shows two clock signals C1 and C2 which have no skew and which there is a difference of T/4 in phase where T is the period of the cycle. FIG. 1B shows two clock signals that are identical to the clock signals of FIG. 1A, in which there is a skew of T1. Clock signals C1 and C2 provide CLK1_Path and CLK2_Path which must be provided to the sense amplifier circuit at the same time. The skew provided by T1 causes problems because these clock paths are skewed. The effect of the skew T1 is that one of the clock paths, in this case CLK2_Path, arrives later than the other.

Accordingly, what is needed is a method and system for reducing speed degradation resulting from clock skew problems.

SUMMARY OF THE INVENTION

The present invention meets the need for reducing speed degradation in sense amplifier circuits. A sense amplifier with improved compensation for clock skew effects in accordance with the present invention includes a sense amplifier enabling mechanism for receiving first and second control signals. The sense amplifier further includes a first logic mechanism for providing the first control signal to a first input of the sense amplifier enabling mechanism, and a second logic mechanism for providing the second control signal to a second input of the sense amplifier enabling mechanism, wherein the first and second logic mechanisms reduce speed degradation by minimizing skew between the first and second control signals.

In a method aspect, a method for reducing speed degradation in a sense amplifier includes providing a pull down device, and coupling the pull down device to first and second signal paths, the first signal path propagating a first clock signal and the second signal path propagating a second clock signal, for reducing speed degradation resulting from skew between the first and second clock signals. The method further includes providing the first signal path to a gate of the pull down device and providing the second signal path to a source of the pull down device.

In a sensor circuit aspect with the sensor circuit receiving at least two clock signals, the sensor circuit includes a sense amplifier, the sense amplifier including a precharge means and a pull down device coupled to the precharge means, the pull down device including a gate, a source, and a drain. The sensor circuit further includes a control mechanism, the control mechanism coupled to the sense amplifier and receiving the at least two clock signals, a first signal of the at least two clock signals being provided to the gate of the pull down device and a second signal of the at least two clock signals being provided to the source of the pull down device.

Through the aspects of the present invention, separation of the input of clock signals for an enabling mechanism of a sense amplifier contributes to the reduction of speed degradation in the sense amplifier. Further, clock skew effects are better compensated for with the provision of the clock signals to different inputs of the enabling mechanism. These and other advantages will be more fully understood with the following detailed description in conjunction with the accompanying drawings.

DESCRIPTION OF THE INVENTION

The present invention relates to improved sense amplifier operations. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein, so that modifications to the sizes and types of components shown for particular design needs are possible.

Figure 1A:
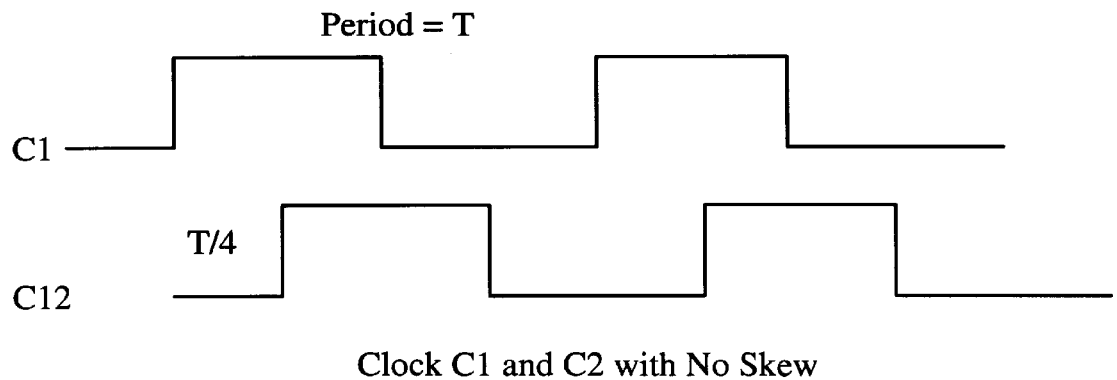
FIG. 1A illustrates two clock signals which have no skew.
Figure 1B:
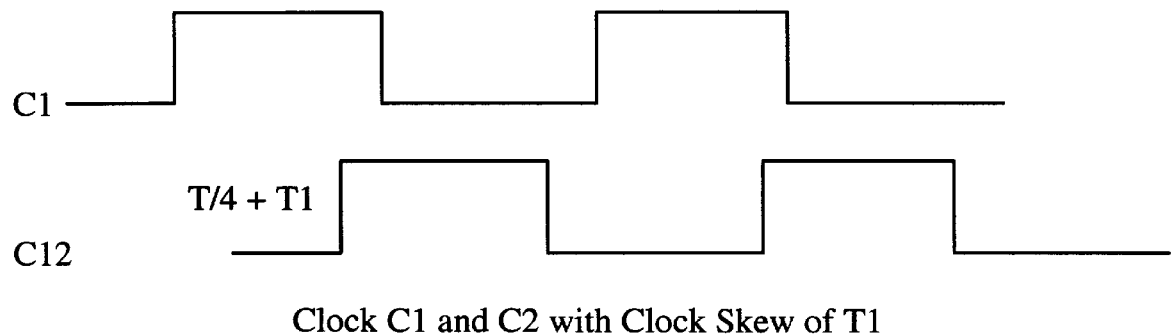
FIG. 1B illustrates two clock signals in which there is a skew.
Figure 2:
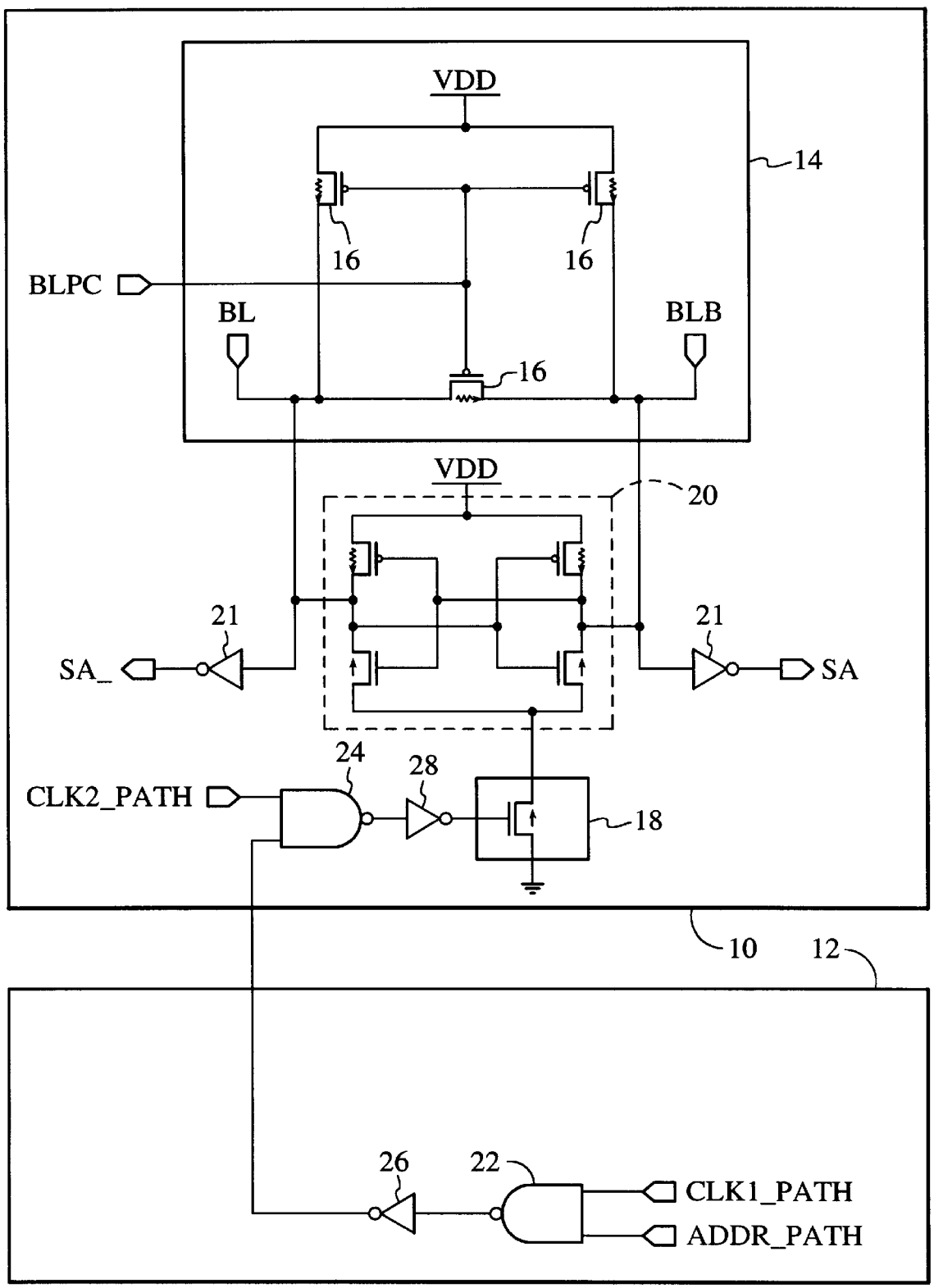
FIG. 2 illustrates a prior art sense amplifier circuit.

FIG. 2 illustrates a prior art sense amplifier 10 and control circuit 12 formed using CMOS (complimentary metal oxide semiconductor) components that has large delay problems due to clock skew of input clock signals. In general, the control circuit 12 provides a global signal to the sense amplifier 10, and the sense amplifier 10 senses the data on bitlines, BL and BLB, during evaluate phase, i.e., during a read operation. During a precharge phase, a precharge circuit 14 provides a bitline precharge signal, BLPC, at a low voltage, e.g., a ground potential, and the bitlines are held at a high voltage potential, e.g., a VDD potential, through transistors 16, e.g., PMOS devices (p-type MOS transistor). Also during precharge phase, the sense amplifier 10 is disabled through a pull down device 18, e.g., an NMOS (n-type MOS) transistor, which is turned off by maintaining an input signal, a SET signal, to its gate at ground potential and its source at the ground potential. The sense amplifier 10 and control circuit 12 have two inputs CLK1_PATH and CLK2_PATH which when there is no skew arrive at the same time to sense amplifier 10 and control circuit 12.

Once the evaluate phase commences, the raising of the bitline precharge signal, BLPC, to the high voltage potential turns off the transistors 16 in the precharge circuit 14. Thus, the bitlines BL and BLB, which are connected to memory storage (not shown), start separating and developing some amount of voltage differential. When an adequate differential voltage is developed between the bitline signals, as is well understood by those skilled in the art, the input SET signal at the gate of the pull down device 18 is charged to the high voltage potential. The high SET signal results when the global signal, N2, from control circuit 12 rises with a CLK2_PATH signal to the high voltage potential at approximately the same time during the evaluation to enable the sense amplifier 10. The global signal N2 suitably results from logical combination of a CLK1_PATH signal with the high voltage potential and an address signal, ADDR_PATH. When the sense amplifier 10 is enabled, the drain of the pull down device 18 in the sense amplifier 10, as designated by node N1, is charged to the ground potential. The sensed data is then appropriately latched through the cross coupled inverters 20, e.g., pull up, IPU1, IPU2, and pull down, IPD1, IPD2, devices, for output as signals SA and SA_from inverters 21, as is well understood by those skilled in the art.

Delay of the sense amplifier 10 is greatly affected by the arrival time of the input SET signal that enables the sense amplifier 10. To optimize the speed of the sense amplifier 10, typically, the paths for input clock1 (C1) and clock2 (C2) signals, indicated as CLK1_PATH and CLK2_PATH signals, respectively, logically combine to produce the SET signal, and are adjustably delayed through circuitry, e.g., NAND gates 22 and 24 and inverters 26 and 28. However, any clock skew between the C1 and C2 clock signals can directly add to the delay of the input SET signal that turns on the sense amplifier 10 and therefore slow down the read access time. Thus, speed degradation of the sense amplifier 10 is increased as a result of clock skew between the clock1 (C1) and clock2 (C2) signals.

Figure 3:
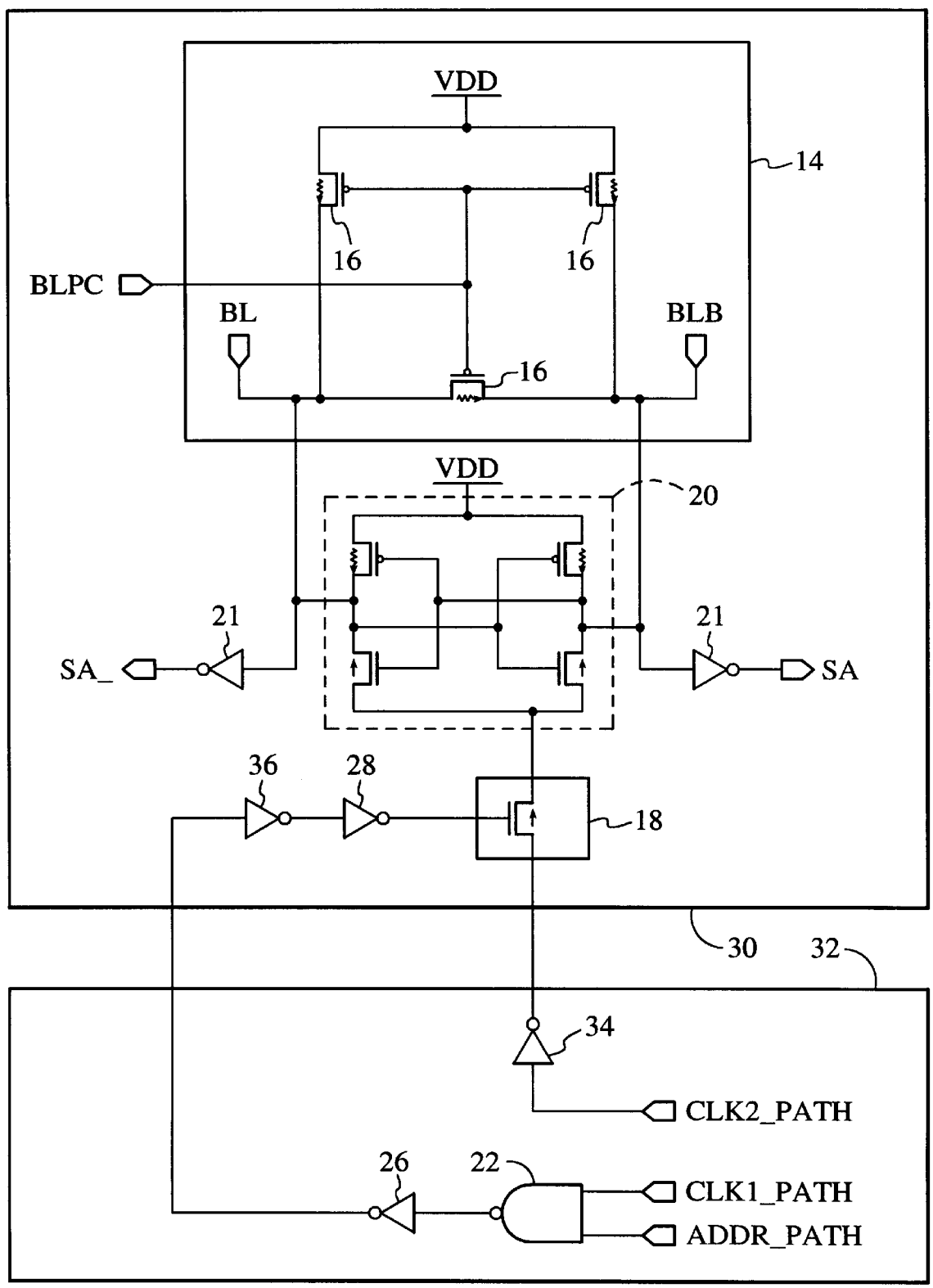
FIG. 3 illustrates a sense amplifier circuit in accordance with the present invention.

The present invention reduces the delay resulting from clock skew through an improved enabling scheme as illustrated in FIG. 3. Components that are equivalent to those of FIG. 2 are labelled similarly. For the sense amplifier 30 and control circuit 32 of FIG. 3, the enabling of the sense amplifier 30 is changed through an alteration of the input of control signals to the pull down device 18. In a preferred embodiment, the CLK2_PATH signal in the control circuit 32 is separated from the CLK1_PATH signal. Further, the CLK2_PATH signal is provided at the source of the pull down device 18 after inversion through an inverter 34, represented as signal SAVSS. The gate of the pull down device 18 still receives the SET signal, but the SET signal now results from a logical combination of CLK1_PATH signal and ADDR_PATH signal through NAND gate 22 and inverters 26, 28, and 36.

With the approach of the present invention for enabling the sense amplifier 30, the speed degradation due to clock skew is minimized. By way of example, with the SAVSS signal from control circuit 32 fed into the source of the pull down device 18 in the sense amplifier 30, during a precharge phase, preferably the SAVSS signal is charged to the high voltage potential, while the SET signal is brought to the ground potential to turn the sense amplifier 30 off. During evaluation operation, preferably the SET signal is charged to the high voltage potential and the SAVSS signal is charged to the ground potential, which turns on the pull down device 18 and enables the sense amplifier 30. The delay time for enabling the sense amplifier 30 is greatly reduced through the connection of the SAVSS signal to the source of the pull down device 18 in the sense amplifier 30, therefore there is less capacitance of the SAVSS node. Further, since there are fewer gates through which the CLK2_PATH signal passes in producing the SAVSS signal than the CLK1_PATH signal in combining to produce the SET signal, any skew between the CLK1_PATH and CLK2_PATH signals is minimized.

Figure 4:
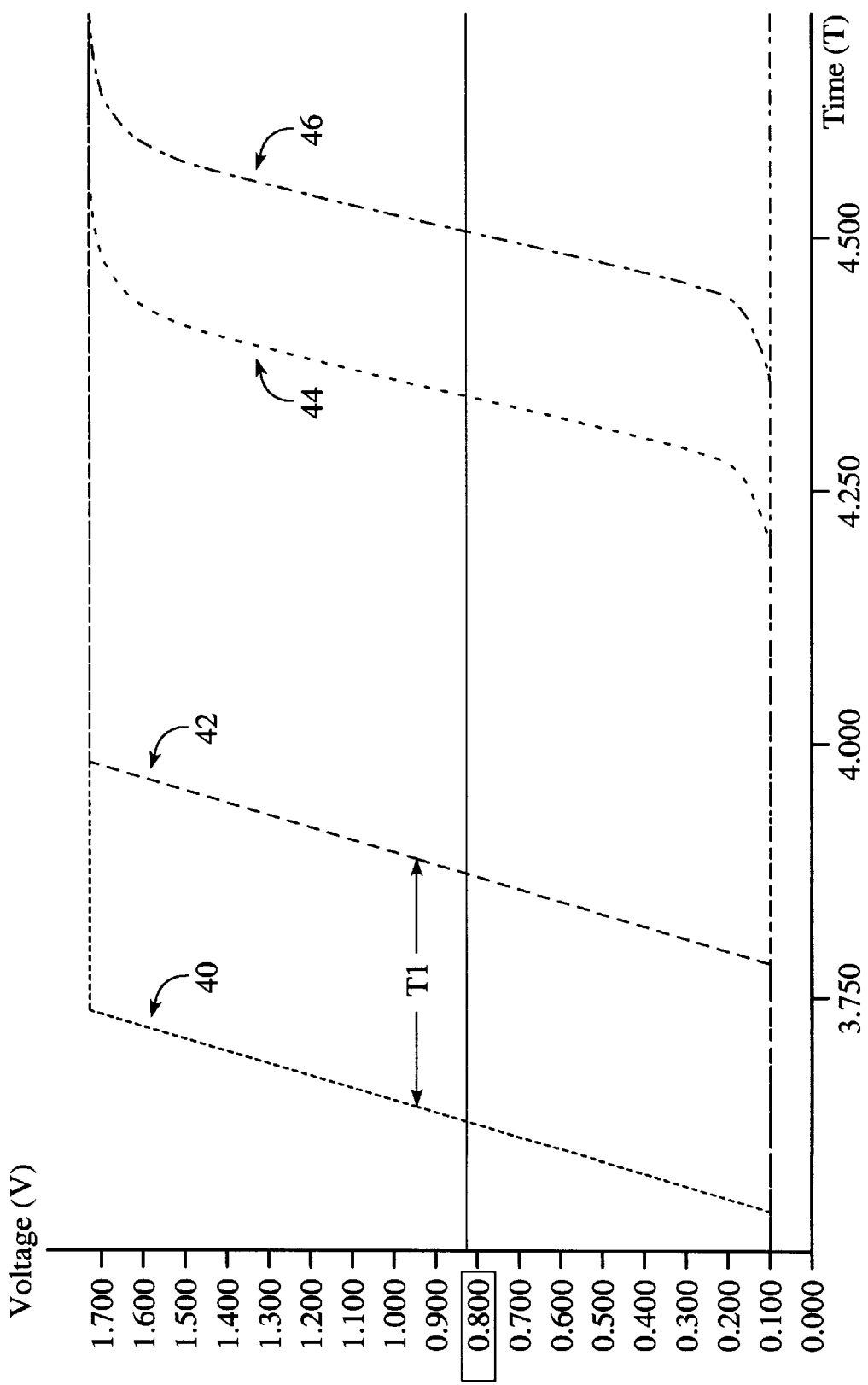
FIG. 4 illustrates a graphical representation of improvement of sense amplifier operation through the implementation of the present invention.

FIG. 4 illustrates the improvement of reducing delay in a sense amplifier by the present invention through a graphical representation of simulated sense amplifier operations for the prior art circuit of FIG. 2 and the circuit of the present invention of FIG. 3. In FIG. 4, the first clock signal, i.e., CLK1_PATH, is represented on the voltage (in volts, V,) versus time (in nanoseconds, ns) graph by waveform 40 and the second clock signal, i.e., CLK2_PATH is represented by waveform 42. As shown, a skew period of T1 separate the second waveform 42 from the first waveform 40. With no clock skew, the second waveform 42 would be in the same position as the first waveform 40. The resulting output of the sense amplifier 30 (FIG. 3) is represented by waveform 44, while the resulting output of the sense amplifier 10 (FIG. 2) is represented by waveform 46. As is clearly shown in FIG. 4, the output of sense amplifier 30 occurs sooner than the output of sense amplifier 10. Thus, speed degradation in a sense amplifier circuit is reduced with the approach of the present invention. Further, through the separation of the input of the clock signals to control enabling of the sense amplifier, better compensation for any clock skew is effectively achieved and results in improved sense amplifier operation.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A sense amplifier with improved compensation for clock skew effects comprising:

sense amplifier enabling means for receiving first and second control signals, wherein the sense amplifier enabling means comprises a transistor;

first logic means for providing the first control signal to a first input of the transistor of the sense amplifier enabling means; and second logic mans for providing the second control signal to a second input of the transistor of the sense amplifier enabling means, wherein the speed degradation resulting from skew between the first and second control signals is reduced.

2. The sense amplifier of claim 1 wherein the sense amplifier enabling means comprises a pull down device.

3. The sense amplifier of claim 2 wherein the pull down device comprises an NMOS transistor device.

4. The sense amplifier of claim 2 wherein the first logic means provides the first control signal to a gate of the pull down device.

5. The sense amplifier of claim 2 wherein the second logic means provides the second control signal to a source of the pull down device.

6. The sense amplifier of claim 1 wherein the first control signal results from a first clock signal.

7. The sense amplifier of claim 6 wherein the second control signal results from a second clock signal.

8. The sense amplifier of claim 6 wherein the first control signal further results from the first clock signal and an address signal.

9. The sense amplifier of claim 7 wherein the second clock signal is skewed from the first clock signal.

10. The sense amplifier of claim 1 wherein the first logic means further comprises a NAND gate and at least one inverter.

11. The sense amplifier of claim 1 wherein the second logic means further comprises an inverter.

12. A method for reducing speed degradation in a sense amplifier, the method comprising:

providing the pull down device for enabling the sense amplifier, wherein the pull down device comprises a transistor; and coupling the pull down device to first and second signal paths, wherein the first signal path is coupled to a first input of the transistor and the second signal path is coupled to a second input of the transistor, the first signal path propagating a first clock signal and the second signal path propagating a second clock signal, for reducing speed degradation resulting from skew between the first and second clock signals.

13. The method of claim 12 wherein providing a pull down device further comprises providing an NMOS transistor.

14. The method of claim 12 wherein coupling the pull down device further comprises providing the first signal path to a gate of the pull down device.

15. The method of claim 14 wherein coupling the pull down device further comprises providing the second signal path to a source of the pull down device.

16. A sensor circuit, the sensor circuit receiving at least two clock signals, the sensor circuit comprising:

a sense amplifier, the sense amplifier including a precharge means and a pull down device for enabling the sense amplifier coupled to the precharge means, the pull down device including a gate, a source, and a drain; and a control means, the control means coupled to the sense amplifier and receiving the at least two clock signals, a first signal of the at least two clock signals being provided to the gate of the pull down device and a second signal of the at least two clock signals being provided to the source of the pull down device.

17. The sensor circuit of claim 16 wherein the control means further comprises a first logic means for propagating the first signal.

18. The sensor circuit of claim 17 wherein the first logic means further comprises a NAND gate and at least one inverter.

19. The sensor circuit of claim 16 wherein the control means further comprises second logic means for propagating the second signal.

20. The sensor circuit of claim 19 wherein the second logic means comprises an inverter.

21. A sense amplifier with improved compensation for clock skew effect comprising:

sense amplifier enabling means for receiving first and second control signals;

first logic means for providing the first control signal, resulting from a first clock signal and an address signal, to a first input of the sense amplifier enabling means; and second logic means for providing the second control signal to a second input of the sense amplifier enabling means, wherein the speed degradation resulting from skew between the first and second control signals is reduced.

22. A method for reducing speed degradation in a sense amplifier, the method comprising:

providing a pull down device for enabling the sense amplifier; and coupling the pull down device to first and second signal paths, the first signal path coupled to a gate of the pull down device, the second signal path is coupled to a source of the pull down device, the first signal path propagating a first clock signal and the second signal path propagating a second clock signal, for reducing speed degradation resulting from skew between the first and second clock signals.

* * * * *